United States Patent [19]

Heller et al.

[11] 4,182,796

[45] Jan. 8, 1980

[54] SEMICONDUCTOR LIQUID JUNCTION PHOTOCELL USING SURFACE MODIFIED GaAs ELECTRODE

[76] Inventors: Adam Heller, Bridgewater; Barry Miller, Murray Hill; Bruce A. Parkinson, New Providence, all of N.J.

[21] Appl. No.: 907,396

[22] Filed: May 18, 1978

[51] Int. Cl.[2] .................. H01M 6/30; H01M 6/36
[52] U.S. Cl. ....................... 429/111; 250/211 J; 250/212
[58] Field of Search ............ 429/111; 250/211 R, 250/211 J, 212

[56] References Cited

PUBLICATIONS

Y. Nakato et al., "Photo-Electrochemical Behaviors of Semiconductor Electrodes Coated with Thin Metal Films," *Chem. Lett.*, pp. 883-886 (1975).
S. Gourgaud et al., "Semiconductor/Electrolyte Photoelectric Energy Conversion: The Use of a Molybdenum Oxide Coating to Avoid Corrosion," *J. Electrochem. Soc.*, vol. 124, pp. 102-107 (1977).
H. Yoneyama et al., "Extension of Spectral Response of p-Type GaP Electrodes by Metal Adatoms," *J. Electrochem. Soc.*, vol. 125, pp. 68-74 (1978).
A. B. Ellis et al., "Studies of n-Type GaAs and GaAp Based Photoelectrochemical Cells. Stabilization by Kinetic Control & Conversion of Optical Energy to Electricity," *J. Am. Chem. Soc.*, vol. 99, pp. 2848-2854 (1977).
K. C. Chang et al., "Stable Semiconductor Liquid Junction Cell with 9 Percent Solar-to-Electrical Conversion Efficiency," *Science*, vol. 196, pp. 1097-1098 (1977).
A. Heller et al., "Spectral Response & Efficiency Relations in Semiconductor Liquid Junction Solar Cells," *J. Electrochem. Soc.*, vol. 124, pp. 697-700 (1977).
H. Gerischer, "Electrochemical Photo & Solar Cells—Principles & Some Experiments," *Electroanalytical Interfacial Electrochem.*, vol. 58, pp. 263-274 (1975).

*Primary Examiner*—Aaron Weisstuch

[57] ABSTRACT

A semiconductor liquid junction photocell using a photoactive electrode comprising GaAs has greatly improved solar energy to electrically conversion efficiency when compared to prior art semiconductor liquid junction photocells using GaAs electrodes. The improved efficiency is obtained by material, such as ruthenium, cobalt, rhodium or lead, on the electrode surface. Efficiency is still further increased by texturizing the surface of the GaAs electrode prior to addition of the material. Efficiencies under AM1 conditions are approximately 12 percent.

4 Claims, 2 Drawing Figures

SEMICONDUCTOR LIQUID JUNCTION PHOTOCELL USING SURFACE MODIFIED GaAs ELECTRODE

TECHNICAL FIELD

This invention deals generally with semiconductor liquid junction photocells and particularly with such photocells using surface modified GaAs electrodes.

BACKGROUND OF THE INVENTION

Concern over the possible depletion of fossil fuel energy sources has generated intense interest in recent years in the search for and development of alternative energy sources. Contemplated alternative energy sources include solar energy utilized as electricity either directly through photovoltaic devices or indirectly through thermal devices. The latter has not received as much attention as the former which will, as presently contemplated, use semiconductor devices. These devices are presently relatively expensive power sources, compared to fossil fuel devices, because the devices collect light generally in proportion to the area of the photosensitive junction which must be large to generate useful photocurrents. The cost of manufacturing such devices depends mainly upon the area of the photosensitive junction and is presently too high to permit successful commercial exploitation in other than specialized applications.

Considerable effort has therefore been expended in attempting to find ways to reduce the cost of solar energy obtained from semiconductor devices. One approach that has generated much interest and enthusiasm recently is a liquid-semiconductor solar cell in which the active part of the cell is a junction formed at a liquid-solid interface. The characteristics of this type of cell are discussed by Gerischer in *The Journal of Electroanalytical Chemistry and Interfacial Electrochemistry* 58, 263 (1975). The junctions in these devices promise to be less costly to manufacture than are the junctions in devices in which the junction is formed between two solids as relatively costly epitaxy or diffusion procedures are not required to form the junction which forms spontaneously in these devices at the semiconductor-liquid interface.

Many semiconductors are presently candidates for the electrode material in such cells. One of the most promising materials is GaAs. GaAs has a bandgap of about 1.4 ev and, since a bandgap of approximately this magnitude theoretically will give the most efficient photovoltaic conversion of solar power into electricity, a high efficiency cell using this material would be extremely desirable from a commercial point of view.

Operation of semiconductor liquid junction photocells using GaAs electrodes and producing stable photocurrent output over an extended time period has been reported in *Science* 196 1097 (1977). The cells reported used n-type single crystal GaAs electrodes in an electrolyte comprising a redox couple consisting of selenide/polyselenide anions. At air mass two (AM2) illumination, open circuit voltages were between 0.65 and 0.75 volts; short circuit currents were between 14 and 18 ma/cm$^2$; and the fill factors were between 0.55 and 0.72. The reported efficiency at AM2 for conversion of solar energy into electricity was approximately 9 percent.

SUMMARY OF THE INVENTION

We have discovered that the efficiency of semiconductor liquid junction photocells containing an n-type electrode comprising gallium arsenide may be improved by modifying the surface of the electrode in contact with the electrolyte. Using a redox couple comprising selenide/polyselenide anions, both the fill factor and the open circuit voltage are increased over previously reported values by including material, such a ruthenium, cobalt, lead or rhodium, on the electrode surface. The amount of material present is within the range extending from the equivalent of a tenth of a monolayer to several monolayers. The material alters surface states which reduce the photovoltages and/or lower the fill factors. In a preferred embodiment, the material is ruthenium and the amount of material present is within the range extending from 0.01 $\mu$gm/cm$^2$ to 1.0 $\mu$gm/cm$^2$.

Further increases in both the open circuit voltage and fill factor as well as the short circuit current are obtained by texturizing the electrode surface prior to deposition of the material. Texturizing is expediently accomplished by etching the electrode, typically in a 1:1 30 percent H$_2$O$_2$—H$_2$SO$_4$ solution for thirty seconds, until the surface turns to a matte black.

Photocells with such GaAs electrodes have fill factors varying between 0.66 and 0.76 and efficiencies for converting solar energy into electricity of approximately 12 percent.

DETAILED DESCRIPTION

Figure 1:
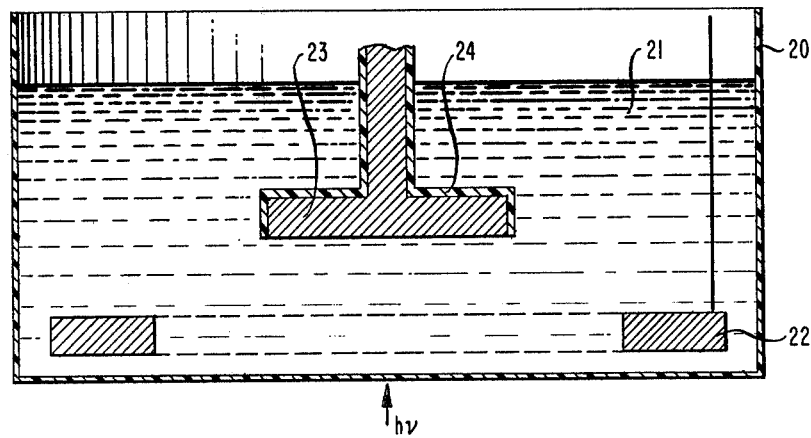
FIG. 1 is a schematic representation semiconductor liquid junction photocell.

The cell structure of FIG. 1 comprises a container 20, liquid electrolyte 21, counter electrode 22, which in our devices is carbon, although other inert materials may be used, and the photoactive n-type electrode 23. Electrode 23 comprises GaAs and it is contemplated that some substances, such as Al, may be present. The electrolyte is typically aqueous although nonaqueous electrolytes, such as propylene carbonate and acetonitrile, can be used. the portion of electrode 23 contacting electrolyte 21 constitutes a surface the modification of which is the subject of this invention. Electrode 23 is insulated with epoxy 24 except where illuminated and activated. The container may be made of any conveniently available glass or plastic material. The bottom of the cell, opposing electrode 23, is transparent to pass incident light as shown.

When the electrode is in a suitable electrolyte, typically aqueous, and illuminated, holes migrate to the surface of the n-type GaAs and cause its oxidative dissolution by the reaction 6h$^+$ + GaAs→Ga(III) + As(III). If this is the only reaction, the material photoetches. The photoetching reaction can be suppressed if a competing reaction can be found that will scavenge holes and compete directly with the photoetching reaction although it may be unable to completely suppress photoetching. A redox couple consisting of selenide anions has been found to suppress photoetching in GaAs cells sufficiently that usable cells can be made. The selenium accepts charge through the reaction 2Se$^=$ + 2h$^+$ →$Se^=_2$ at the photoactive electrode. The reaction at the nonphotoactive electrode is $Se^=_2 + 2e \rightarrow 2Se^=$ and there is no net chemical change in the cell. Suitable redox couple concentrations in aqueous solutions range from a maximum represented by a saturated solution to a minimum of approximately 0.1 M which represents the minimum concentration needed to consume sufficient holes, when the electrode is illuminated by sunlight, to prevent unduly rapid photoetching. Other than aqueous electrolytes may also be used but since they generally have a lesser electrical conductivity, cell efficiency is reduced at the relatively high currents produced when the cell is illuminated by sunlight. For high redox couple concentrations, light absorption in the electrolyte can be compensated for by making the liquid layer thin.

Diselenide ion and polyselenide ions may be formed in the solution by a conventional technique such as passing $H_2Se$ into a basic solution, e.g., an aqueous solution of KOH, and permitting air to oxidize some of the $Se^=$ to $Se^=_2$ or by directly dissolving elemental Se. Other bases such as NaOH and $NH_4OH$ may also be used.

The photoactive electrode comprises n-type GaAs. Small amounts of other substances, such as Al, may be present in the electrode. If single crystal, it may be grown by any of the well-known crystal growth techniques. Typical carrier concentrations are between $10^{15}/cm^3$ and $2 \times 10^{17}/cm^3$.

Modification of the electrode surface which contacts the liquid has been found crucial to increased cell efficiency. Surface modified electrodes prepared by the following methods and having the described characteristics have been found to yield photocells with greatly enhanced performance characteristics.

A layer of materials which alters surface states initially within the bandgap of the GaAs and increases the photovoltage and the fill factor and reduces recombination is formed on the electrode surface. The material is present in an amount within the range extending from a tenth of a monolayer to five monolayers. The precise form of the material is not known with certainty but is believed to be a compound of the material. Material comprising at least one member selected from the group consisting of lead, rhodium, cobalt and ruthenium has been found to be effective.

Material consisting essentially of ruthenium has been found to be especially effective. Useful amounts of ruthenium range from approximately one-tenth of a monolayer to several monolayers or amounts between 0.01 $\mu gm/cm^2$ and 1.0 $\mu gm/cm^2$. The preferred range is between 0.01 $\mu gm/cm^2$ and 0.1 $\mu gm/cm^2$. While lesser amounts of ruthenium might still improve cell efficiency somewhat, the number of surface states changed is not maximized. Above 1.0 $\mu gm/cm^2$, layer development begins to modify light absorption by the semiconductor.

The precise form of the ruthenium on the electrode surface is not known with certainty. It is possible that the form in which the ruthenium is initially incorporated is altered by surface reactions in the selenide solution.

The following methods have been found suitable for forming the ruthenium layer. The GaAs electrode may be immersed briefly, for example, for approximately thirty seconds, in solutions of the metal ions as simple salts in 0.1 M $HNO_3$, and withdrawn and rinsed in water. For example, a 0.01 M solution of $RuCl_3$ in dilute $HNO_3$ has been found to produce satisfactory results. Other salts such as nitrate or nitrosyl chloride may also be used. The concentration of the salts may range from $10^{-6}$ M to $10^{-1}$ M. Below $10^{-6}$ M, excessive treatment times might be necessary.

Concentrations above $10^{-1}$ M will not reduce treatment time. Times will vary with concentration in well-known manner. Other acids, such a perchloric or hydrochloric, can also be used. The acid concentration may vary from 0.01 M to 1.0 M. Above 1.0 M, the semiconductor may be etched. Below 0.01 M, the metal ions may hydrolyze excessively.

The ruthenium layer may also be formed by adding small amounts of ruthenium to the cell electrolyte. Typical amounts range from $10^{-6}$ to $10^{-5}$ M when added as $RuCl_3 \cdot H_2O$. When the ruthenium is added in this manner, the improved cell performance manifests itself more slowly, typically taking several hours to approach the performance obtained by the first method described.

Lead, cobalt and rhodium layers on the electrode surface are formed by methods similar to those described for ruthenium but the resulting beneficial effects are not as great as they are for ruthenium.

Solutions of noble metals, such as Pd and Pt, deposit layers of the metals on the surface of the GaAs electrode. These layers produce a severe and permanent decline in cell voltage and current. This is expected if multiple surface states are added within the forbidden gap and the surface becomes too metallic.

Cell performance has been found to be still further improved if the electrode surface is further modified by increasing its surface area. An expedient method is texturizing, as by etching, prior to formation of the layer of material. The texturizing procedure has been found crucial for optimizing the short circuit current. The subsequent surface modification by formation of a layer of material on the texturized surface increases the open circuit voltage and fill factor.

An expedient texturizing process will be described briefly. The GaAs electrode is etched repeatedly in a 1:1 solution of 30 percent $H_2O_2$ and an acid, for example, sulphuric, nitric or phosphoric, for several seconds at a time at a temperature of approximately 25 degrees C. The electrode is rinsed upon each withdrawal with deionized water until a shiny surface is obtained. The electrode is then etched in the same solution for ten to thirty seconds without etchant convection until the surface turns to a matte black. This is most easily done by dipping the electrode in the etchant, removing, visually observing the transformation of the electrode surface, and then rinsing.

The texturizing process controls the gross topography of the electrode surface and increases the ratio of absorbed to reflected light. The texturizing process produces hillocks, having dimensions comparable to the wavelength of the incident light, in the electrode surface. The hillocks result in higher absorption of the incident light.

Figure 2:
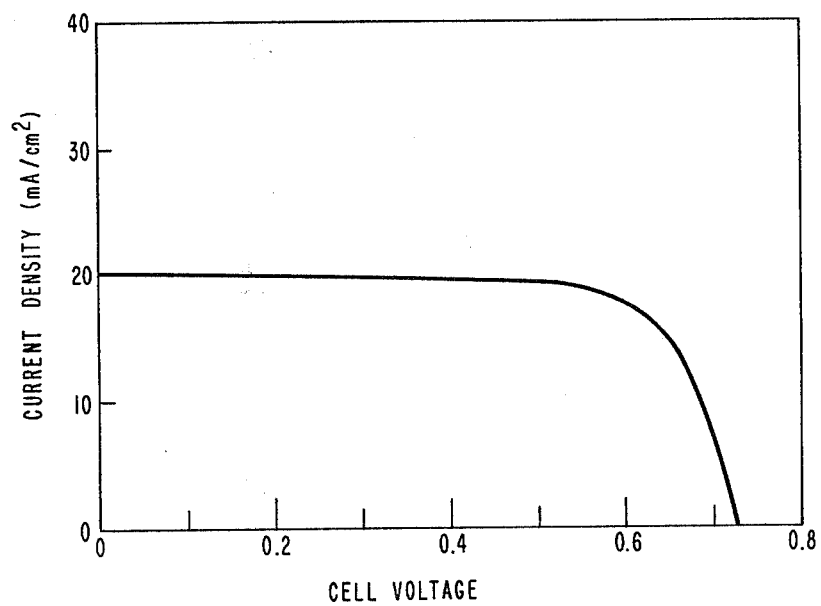
FIG. 2 is a plot of photocurrent, in ma/cm$^2$, versus voltage, in tenths of a voltage, for a photocell with a GaAs electrode of this invention.

The performance of a cell having an etched electrode with a layer of ruthenium is shown in FIG. 2. The electrode was an n-type GaAs single crystal having a carrier concentration of approximately $5 \times 10^{15}/cm^3$. The measuring techniques used were standard techniques such as those described in *Journal of the Electrochemical Society* 124, 697 (1977). The surface was texturized with the described etching process. The electrode surface then had a layer of ruthenium formed by dipping the electrode for thirty seconds in 0.01 M $RuCl_3$ in $HNO_3$. The total selenium concentration in the cell was approximately 1 M and the KOH concentration was the same. On a clear day in May in Murray Hill, N.J., with the sun approximately 30 degrees from the zenith, and without an antireflection coating, the cell delivered $10.6 \pm 1.0$ mw/cm$^2$, an efficiency of 10.9 percent. Typical fill factors ranged from 0.66 to 0.76.

A second cell having a GaAs electrode prepared as described in the previous paragraph but with a carrier concentration of approximately $6 \times 10^{16}$/cm$^3$ was illuminated under conditions similar to those described in the previous paragraph. At 95 mw/cm$^2$ insolation, the cell delivered 11.4 mw/cm$^2$ for an efficiency of 12.0 percent.

What is claimed is:

1. A photocell containing an n-type electrode, said n-type electrode comprising gallium arsenide, and a liquid electrolyte containing a redox couple comprising selenide anions, said n-type electrode having a surface in contact with said electrolyte, CHARACTERIZED IN THAT said surface further contains at least one material selected from the group consisting of Ru, Co, and Rh, said material being present in an amount greater than one-tenth of a monolayer and less than five monolayers, said material altering surface states initially within the bandgap of said gallium arsenide and reducing recombination.

2. A photocell as recited in claim 1 in which said material consists essentially of Ru, said material being present in an amount greater than 0.01 $\mu$gm/cm$^2$ and less than than 1.0 $\mu$gm/cm$^2$.

3. A photocell as recited in claim 2 in which said surface density is less than 0.1 $\mu$gm/cm$^2$.

4. A photocell as recited in claim 1 or 2 in which said surface further comprises a texturized surface, said material being present on said texturized surface.

* * * * *

UNITED STATES PATENT AND TRADEMARK OFFICE
CERTIFICATE OF CORRECTION

PATENT NO. : 4,182,796
DATED : January 8, 1980
INVENTOR(S) : Adam Heller, Barry Miller, and Bruce A. Parkinson It is certified that error appears in the above-identified patent and that said Letters Patent are hereby corrected as shown below:

Abstract page, under "Inventors", insert --Assignee: Bell Telephone Laboratories, Incorporated, Murray Hill, N.J.--; under "Primary Examiner", insert --Attorney, Agent, or Firm-Richard D. Laumann--.

Signed and Sealed this

Twenty-second Day of April 1980

[SEAL]

Attest:

SIDNEY A. DIAMOND

*Attesting Officer*   *Commissioner of Patents and Trademarks*